United States Patent
Nakayama et al.

(10) Patent No.: US 9,234,092 B2
(45) Date of Patent: Jan. 12, 2016

(54) LIQUID-CRYSTAL POLYESTER RESIN COMPOSITION, MOLDED OBJECT THEREOF, AND OPTICAL DEVICE

(75) Inventors: Toshio Nakayama, Tokyo (JP); Satoshi Murouchi, Tokyo (JP); Miyuki Shiraishi, Tokyo (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 427 days.

(21) Appl. No.: 13/497,186

(22) PCT Filed: Aug. 18, 2010

(86) PCT No.: PCT/JP2010/063896
§ 371 (c)(1),
(2), (4) Date: Jun. 4, 2012

(87) PCT Pub. No.: WO2011/040138
PCT Pub. Date: Apr. 7, 2011

(65) Prior Publication Data
US 2012/0235559 A1    Sep. 20, 2012

(30) Foreign Application Priority Data
Sep. 29, 2009 (JP) .................................. 2009-224825

(51) Int. Cl.
| C09K 19/06 | (2006.01) |
| C08K 9/06 | (2006.01) |
| C09K 19/38 | (2006.01) |
| F21V 7/22 | (2006.01) |
| C08K 7/04 | (2006.01) |
| C08K 9/02 | (2006.01) |
| B29L 11/00 | (2006.01) |
| B29K 105/00 | (2006.01) |
| B29K 105/16 | (2006.01) |
| H01L 33/48 | (2010.01) |

(52) U.S. Cl.
CPC ... C08K 9/06 (2013.01); C08K 7/04 (2013.01); C08K 9/02 (2013.01); C09K 19/3809 (2013.01); F21V 7/22 (2013.01); B29K 2105/0079 (2013.01); B29K 2105/16 (2013.01); B29L 2011/0083 (2013.01); H01L 33/486 (2013.01); H01L 2924/0002 (2013.01)

(58) Field of Classification Search
CPC ... C08L 67/03; B29L 2011/0083; C08K 7/04; C08K 3/22; H01L 2924/0002; C09K 19/3809; F21V 7/22
USPC .................. 313/498, 512; 252/299.01, 299.6
See application file for complete search history.

(56) References Cited

U.S. PATENT DOCUMENTS

| 7,713,439 B2* | 5/2010 | Murouchi et al. ....... 252/299.01 |
| 8,653,179 B2 | 2/2014 | Jung et al. |
| 2004/0165390 A1 | 8/2004 | Sato et al. |
| 2007/0295244 A1 | 12/2007 | Himmelreich et al. |
| 2009/0250662 A1 | 10/2009 | Murouchi et al. |
| 2011/0060084 A1 | 3/2011 | Jung et al. |
| 2012/0097894 A1 | 4/2012 | Nakayama et al. |

FOREIGN PATENT DOCUMENTS

| JP | 5-286721 | 11/1993 |
| JP | 6-38520 | 5/1994 |
| JP | 9-3211 | 1/1997 |
| JP | 09003211 A * | 1/1997 |
| JP | 2002-179779 | 6/2002 |
| JP | 2004-256673 | 9/2004 |
| JP | 2004-277539 | 10/2004 |
| JP | 2005-306927 | 11/2005 |
| JP | 2006-37090 | 2/2006 |
| JP | 2007-254669 | 10/2007 |
| JP | 2008-88207 | 4/2008 |
| KR | 10-0905089 | 6/2009 |
| TW | 200736333 | 10/2007 |
| WO | 2009/069741 | 6/2009 |

OTHER PUBLICATIONS

International Search Report for PCT/JP2010/063896, mail date is Nov. 16, 2010.
English language translation of International Preliminary Report on Patentability and Written Opinion for PCT/JP2010/063896, mail date is Apr. 12, 2012.
Manabu Seino, "Titanium Oxide—physicality and applied technology," Gijutsudo, Jun. 25, 1991, pp. 30-31 and 121; along with a partial English language translation thereof.
Office Action for Taiwanese Patent Application No. 099128972, which is dated Jul. 14, 2014.
Office Action for Japanese Patent Application No. 2009-224825, which was mailed on Jan. 20, 2015.
"New Edition: Encyclopedia of Higher Molecules," vol. 6, published by Asakura Publishing Co., Ltd., Mar. 20, 2001, pp. 72 and 73; along with a partial translation thereof.
Yoshinobu Nakamura et al., "Effects of Silane Coupling Agent and Uses Thereof [New Edition]," Science & Technology, vol. 1, Jun. 7, 2010; along with a partial translation thereof.
Office Action issued with respect to patent family member Chinese Patent Application No. 201080043346.X, mailed Dec. 27, 2012.

* cited by examiner

*Primary Examiner* — Karabi Guharay
(74) *Attorney, Agent, or Firm* — Greenblum & Bernstein, P.L.C.

(57) ABSTRACT

A liquid-crystal polyester resin composition according to the present invention contains 100 parts by mass of a liquid-crystal polyester (A), 50 to 150 parts by mass of a titanium oxide (B) having been subjected to an aluminum oxide treatment, a silicon oxide treatment and an organosiloxane treatment as surface treatments, and 0 to 50 parts by mass of an inorganic fibrous filler (C).

6 Claims, No Drawings

LIQUID-CRYSTAL POLYESTER RESIN COMPOSITION, MOLDED OBJECT THEREOF, AND OPTICAL DEVICE

TECHNICAL FIELD

The present invention relates to a liquid-crystal polyester resin composition, an injection molded object thereof, and an optical device using the molded object. Particularly, the present invention relates to an optical device using a light emitting diode (hereinafter, referred to as "LED").

BACKGROUND ART

Optical devices, such as illuminating devices and display devices, using LEDs as light sources are used in broad areas. These are usually provided with an LED device in which an LED element is mounted on a circuit pattern on a substrate by an electroconductive adhesive, a solder or the like and necessary interconnection is made through wire bonding. The LED device is provided in the circumference of the LED element with a reflector (reflecting plate) to raise light utility of the LED, and the LED element located in the reflector is encapsulated with a transparent resin.

As white LEDs, there are generally known ones fabricated so as to provide a white color by combining a plurality of LEDs including a green (G: 525 nm), a blue (B: 470 nm) and a red (R: 630 nm), and ones utilizing the action of the wavelength conversion by blending fluorescent substances in an encapsulating resin. In the case of the latter, an ultraviolet light emitting LED is used as a light source in some cases. As reflectors of these white LEDs, a molded object of a resin composition in which a white pigment particle such as a metal oxide is blended is used in some cases. In the case of a resin-made LED reflector, the reflector is demanded to have a sufficient heat resistance to a heating step of heating a solder or the like when an LED element is mounted on a substrate, the heat generation at thermal curing of an encapsulating resin, the heating when an LED device is connected to another member, the heating in an environment using an LED device, and the like.

In consideration of the above-mentioned situation, as materials to form LED reflectors, resin compositions are proposed which contain a liquid-crystal polyester having an excellent heat resistance, and a white pigment (for example, see Patent Literatures 1 to 4).

CITATION LIST

Patent Literature

Patent Literature 1: Japanese Examined Patent Application Publication No. 6-38520
Patent Literature 2: Japanese Patent Application Laid-Open Publication No. 2004-256673
Patent Literature 3: Japanese Patent Application Laid-Open Publication No. 2004-277539
Patent Literature 4: Japanese Patent Application Laid-Open Publication No. 2007-254669

SUMMARY OF INVENTION

Technical Problem

An LED reflector is required to maintain a high light reflectance over a long period, and particularly in the case of a white LED reflector, the LED reflector is demanded to exhibit a sufficiently high reflectance to light in the wavelength region of 500 nm or shorter. However, the LED reflectors formed of liquid-crystal polyester resin compositions in Patent Literatures 1 and 2 shown above have a problem of having a lower reflectance to light of 480 nm as a reflectance index of white light than those formed of conventionally-used polyamide-based resin compositions.

The injection molded objects of liquid-crystal polyester resin compositions in Patent Literatures 3 and 4 shown above, although having an improved light reflectance at 480 nm, necessitate blending a large amount of a white pigment in order to raise the reflectance, posing a risk of decreasing the mechanical strength of the molded objects. In recent years, the weight and size reduction of electric and electronic devices have progressed more and more, and since along with that, down-sizing and thickness reduction of electronic parts such as LED reflectors have progressed, the requirement level for the strength of members has been raised. Therefore, even the liquid-crystal polyester resin compositions described in Patent Literatures 3 and 4 still have room for improvement in the point of the mechanical strength.

As a white pigment added to a liquid-crystal polyester, metal oxides having a heat resistance to a high processing temperature and a high hiding power are used; and above all, titanium oxide is often used. In titanium oxide, there are known ones having been subjected to a surface treatment such as an aluminum oxide treatment in order to improve the affinity for a resin, the dispersibility and the like. In order to enhance the reflectance of a liquid-crystal polyester resin composition to white light, making the blending amount of titanium oxide large is conceivable. However, the studies by the present inventors have found that even if titanium oxide is the one having been subjected to a surface treatment shown above, much blending thereof makes a resin composition brittle, and largely decreases mechanical strength, particularly Izod impact strength. The causes are conceivably that secondary aggregation and faulty dispersion of the titanium oxide particle occur, that the amount of a liquid-crystal polyester in the resin composition is made relatively small, and other causes.

On the other hand, addition of titanium oxide to a liquid-crystal polyester is generally carried out by melting and kneading. Since titanium oxide being a metal oxide is an acidic compound, in a melting and kneading step, it follows that the liquid-crystal polyester in a melting state and the acidic compound coexist, and a large shearing force is continually exerted. Thereby, molecular chain scission of the liquid-crystal polyester occurs; and a decrease in the molecular weight, the formation of low-molecular weight components, and the like become liable to occur, resulting in a decrease in the melt viscosity of the resin composition, and conceivably also a decrease in the mechanical strength, particularly Izod impact strength, of the molded object. It is conceivable that this phenomenon similarly occurs also in a plasticizing step when a resin composition is injection molded. Additionally, since such a phenomenon presumably becomes more remarkable at higher temperatures, it is conceivable that the higher the melting point of a liquid-crystal polyester, the larger the influences of steps in production and molding of a composition. Therefore, although a whole aromatic thermotropic liquid-crystal polyester having a melting point exceeding 320° C. and the like has an excellent heat resistance, practical usage of such resin materials has been limited.

As described above, a liquid-crystal polyester resin composition blended with a conventional surface-treated titanium oxide cannot provide an injection molded object simultaneously satisfying, at high levels, both the light reflectance and the mechanical strength, particularly the Izod impact strength, in LED reflectors in which the size and thickness reduction is remarkable.

The present invention has been achieved in consideration of the above-mentioned situation, and has an object to provide: a liquid-crystal polyester resin composition which can provide a molded object simultaneously satisfying, at high levels, both the light reflectance at 480 nm and the mechanical strength such as Izod impact strength; a molded object thereof; and an optical device having the molded object.

Solution to Problem

As a result of exhaustive studies to solve the above-mentioned problems, the present inventors have found that an injection molded object having a higher reflectance to light of a wavelength of 480 nm than conventional ones and having a high Izod impact strength is obtained by blending a titanium oxide having being subjected to a specific surface treatment in a specific proportion in a liquid-crystal polyester, and this finding has led to the completion of the present invention.

The liquid-crystal polyester resin composition according to the present invention comprises 100 parts by mass of a liquid-crystal polyester (A), 50 to 150 parts by mass of a titanium oxide (B) having been subjected to an aluminum oxide treatment, a silicon oxide treatment and an organosiloxane treatment as surface treatments, and 0 to 50 parts by mass of an inorganic fibrous filler (C).

The liquid-crystal polyester resin composition according to the present invention can provide a molded object simultaneously satisfying, at high levels, both the light reflectance at 480 nm and the mechanical strength such as Izod impact strength, by having the above-mentioned constitution. The liquid-crystal polyester resin composition according to the present invention can be prepared by a usual melting and kneading step and molded by injection molding; and this case also can provide the above-mentioned advantage according to the present invention. Further, although the liquid-crystal polyester resin composition according to the present invention has a lower melt viscosity at 370° C. than the cases of using conventional titanium oxide, a molded object having an excellent mechanical strength can be obtained; and this fact can be said to be an unexpected advantage, in consideration of the problem of the molecular chain scission of the liquid-crystal polyester by melt shearing.

The liquid-crystal polyester (A) is preferably a wholly aromatic thermotropic liquid-crystal polyester having a melting point of 320° C. or higher.

The titanium oxide (B) is preferably one having a primary particle diameter in the range of 0.2 to 0.3 μm.

A molded object obtained by injection molding the liquid-crystal polyester resin composition according to the present invention preferably has a reflectance of 85% or higher to light of a wavelength of 480 nm on the molded surface thereof, and an Izod impact strength of 40 kJ/m² or higher.

The present invention also provides a molded object obtained by injection molding one of the above-mentioned liquid-crystal polyester resin compositions according to the present invention.

The present invention further provides an optical device having a light source, and a reflector of the light source, the reflector being composed of the molded object according to the present invention.

In the optical device according to the present invention, the light source is preferably a white LED.

Advantageous Effects of Invention

The present invention can provide: a liquid-crystal polyester resin composition which can provide a molded object simultaneously satisfying, at high levels, both the light reflectance at 480 nm and the mechanical strength such as Izod impact strength; a molded object thereof; and an optical device having the molded object.

The liquid-crystal polyester resin composition according to the present invention, even if being one prepared through a usual melting and kneading step, holds excellent heat resistance and moldability of liquid-crystal polyesters, and can form a molded object excellent in the white light reflectance and the Izod impact strength by injection molding. An injection molded object of the liquid-crystal polyester resin composition according to the present invention can be used as a reflector with a surface of the molded object as a reflecting surface, and can be used particularly as a reflector suitable for a white LED. Since the present invention can achieve a reflector having a higher reflectance than conventional ones and being excellent in the mechanical strength as well, the present invention can provide an optical device having the reflector and being excellent in the light extraction efficiency.

DESCRIPTION OF EMBODIMENTS

<Liquid-Crystal Polyester (A)>

The liquid-crystal polyester (hereinafter, simply abbreviated to "LCP" in some cases) according to the present invention is a polyester referred to as a thermotropic liquid-crystal polymer, and forms an anisotropic melt at a temperature of 450° C. or lower. Examples of LCP include ones comprising a structural unit selected from an aromatic hydroxycarbonyl unit, an aromatic and/or aliphatic dihydroxy unit, an aromatic and/or aliphatic dicarbonyl unit, or the like. Examples of the aromatic hydroxycarbonyl unit include structural units formed from p-hydroxybenzoic acid, 6-hydroxy-2-naphthoic acid and the like; examples of the aromatic and/or aliphatic dihydroxy unit include structural units formed from 4,4'-dihydroxybiphenyl, hydroquinone, 3,3',5,5'-tetramethyl-4,4'-dihydroxybiphenyl, tert-butylhydroquinone, phenylhydroquinone, 2,6-dihydroxynaphthalene, 2,7-dihydroxynaphthalene, 2,2-bis(4-hydroxyphenyl)propane, 4,4'-dihydroxydiphenyl ether, ethylene glycol, 1,3-propylene glycol, 1,4-butanediol and the like; and examples of the aromatic and/or an aliphatic dicarbonyl unit include structural units formed from terephthalic acid, isophthalic acid, 2,6-naphthalene dicarboxylic acid, 4,4'-diphenyldicarboxylic acid, 1,2-bis(phenoxy)ethane-4,4'-dicarboxylic acid, 1,2-bis(2-chlorophenoxy)ethane-4,4'-dicarboxylic acid, 4,4'-diphenyl ether dicarboxylic acid, adipic acid, sebacic acid and the like.

The liquid-crystal polyester used in the present invention is preferably a wholly aromatic thermotropic liquid-crystal polyester because of being excellent in the balance between moldability, mechanical strength and heat resistance. Examples of the wholly aromatic thermotropic liquid-crystal polyester include one comprising a combination of an aromatic dicarboxylic acid, an aromatic diol and an aromatic dihydroxycarboxylic acid, one comprising different types of aromatic hydroxycarboxylic acids, one comprising a combination of an aromatic dicarboxylic acid and an aromatic diol, and one obtained by reacting a polyester such as a polyethylene terephthalate with an aromatic hydroxycarboxylic acid.

In the case of fabricating an LED reflector, since the soldering heat resistance is demanded, use of a wholly aromatic thermotropic liquid-crystal polyester having a melting point of 320° C. or higher is preferable.

In order to obtain a wholly aromatic thermotropic liquid-crystal polyester having a melting point of 320° C. or higher, 40 mol % or more of p-hydroxybenzoic acid is preferably used as a raw material monomer. In addition to this, a suitable combination of other well-known aromatic hydroxycarboxylic acids, aromatic dicarboxylic acids and aromatic dihydroxy compounds can be used. Preferable examples thereof include polyesters obtained from aromatic hydroxycarboxylic acids such as p-hydroxybenzoic acid and 6-hydroxy-2-naphthoic acid alone, and liquid-crystal polyesters obtained from the aromatic hydroxycarboxylic acids and further aromatic dicarboxylic acids such as terephthalic acid, isophthalic acid and 2,6-naphthalenedicarboxylic acid and/or aromatic dihydroxy compounds such as hydroquinone, resorcin, 4,4'-dihydroxybiphenyl and 2,6-dihydroxynaphthalene.

Especially preferable is a wholly aromatic thermotropic liquid-crystal polyester obtained by polycondensating 80 to 100 mol % of p-hydroxybenzoic acid (I), terephthalic acid (II) and 4,4'-dihydroxybiphenyl (III) (including these derivatives) (provided the total of (I) and (II) is 60 mol % or more) with 0 to 20 mol % of another aromatic compound capable of polycondensating with one of (I), (II) and (III).

In production of a wholly aromatic thermotropic liquid-crystal polyester, in order to shorten the melt polycondensation time and reduce an influence of thermal history in the step, the melt polycondensation is preferably carried out after hydroxyl groups of the above-mentioned monomers are previously acetylated. In order to further simplify the step, the acetylation is preferably carried out by feeding acetic anhydride to the monomers in a reaction tank. The acetylation step is preferably carried out using the same reaction tank as the melt polycondensation step. That is, it is preferable that the raw material monomers are subjected to the acetylation reaction with acetic anhydride, and after the completion of the reaction, the temperature is raised and the acetylated monomers proceed to the polycondensation reaction.

In the case where the melt polycondensation reaction is carried out accompanied by an acetic acid-elimination reaction of the acetylated monomers, the reaction is preferably carried out using a reaction tank equipped with monomer feed means, acetic acid discharge means, melted polyester taking-out means and stirring means. Such a reaction tank (polycondensation apparatus) can suitably be selected from well-known ones. The polymerization temperature is preferably 150° C. to 350° C. After the completion of the acetylation reaction, the temperature is raised to a polymerization initiation temperature to initiate the polycondensation; and preferably, the temperature is raised in the range of 0.1° C./min to 2° C./min, and up to 280 to 350° C. as a final temperature. As a catalyst for the polycondensation reaction, a compound of Ge, Sn, Ti, Sb, Co, Mn, Mg or the like can be used. The polycondensation temperature is raised corresponding to a rise in the melting temperature of a formed polymer by the progress of the polycondensation.

In the melt polycondensation, when the flow-point reaches 200° C. or higher, preferably 220° C. to 330° C., a wholly aromatic thermotropic liquid-crystal polyester of a low degree of polymerization is extracted as it is in the melting state from a polymerization tank, and fed to a cooler such as a steel belt or a drum cooler to cool and solidify the liquid-crystal polyester.

Then, the solidified wholly aromatic thermotropic liquid-crystal polyester of a low degree of polymerization is ground to a size suitable for a succeeding solid-phase polycondensation. The grinding method is not especially limited, but examples thereof include impact grinding machines such as Feather Mill, Victory Mill, Coloplex, Pulverizer, Contraplex, Scroll Mill and ACM Pulverizer, made by Hosokawa Micron Corp., and Roll Granulator being a bridged cracking-type granulator, made by Matsubo Corp. Especially preferable is Feather Mill made by Hosokawa Micron Corp. In the present invention, the particle size of a ground material is not especially limited, but is preferably, in terms of industrial sieve (Tyler mesh), in the range of passing 4-mesh to not passing 2,000-mesh, more preferably 5-mesh to 2,000-mesh (0.01 to 4 mm), and most preferably 9-mesh to 1,450-mesh (0.02 to 2 mm).

Then, the ground material obtained in the grinding step is placed on a solid-phase polycondensation step to carry out solid-phase polycondensation. An apparatus and an operational condition used in the solid-phase polycondensation step are not especially limited, and a well-known apparatus and method can be used. In order to use the liquid-crystal polyester as an LED reflector, the solid-phase polycondensation reaction is preferably carried out until a liquid-crystal polyester having a melting point of 320° C. or higher is obtained.

The content of the liquid-crystal polyester (A) in the resin composition is preferably 40 to 60% by mass, and more preferably 40 to 50% by mass, based on the total amount of the resin composition.

<Titanium Oxide (B)>

Titanium oxide used in the present invention is one having been subjected to an aluminum oxide treatment, a silicon oxide treatment and an organosiloxane treatment as surface treatments.

Titanium oxide comes in rutile-type one and anatase-type one, and rutile-type titanium oxide, which has a large hiding power, is preferable. Titanium oxide can be used which is obtained by a conventionally well-known optional production method such as the sulfuric acid method and the chlorine method. Above all, titanium oxide produced by the chlorine method is preferable because of being excellent in whiteness.

The primary particle diameter (a number-average particle diameter of particles in a minimum unit clearly separable from others) of titanium oxide is preferably 0.05 to 0.5 μm, and more preferably 0.2 to 0.3 μm. If the primary particle diameter is smaller than the lower limit, the light shielding property and the light reflectance become insufficient in some cases, and faulty penetration of a powder raw material into a screw occurs in melting and kneading by an extruding machine, remarkably decreasing the extrusion amount and decreasing the productivity, which is not preferable. If the primary particle diameter exceeds the upper limit, the impact strength decreases in some cases. Here, the number-average particle diameter is measured by a general method such as a dynamic light scattering method or a laser light scattering method.

Titanium oxide used in the present invention is subjected to surface treatments of an aluminum oxide treatment, a silicon oxide treatment and an organosiloxane treatment. Methods of these surface treatments can use well-known methods. Usable examples of a method for carrying out an aluminum oxide treatment on the surface of titanium oxide include a method described in Japanese Patent Application Laid-Open Publication No. 5-286721 or a method described as a conventional method in the Patent Literature. Examples of a method for carrying out a silicon oxide treatment on the surface of titanium oxide includes a method described in paragraph [0032] of Japanese Patent Application Laid-Open Publication No. 9-124968. Examples of a method for carrying out an organosiloxane treatment on the surface of titanium oxide include methods described in paragraphs [0054] and [0055] of Japanese Patent Application Laid-Open Publication No. 2005-306927.

These treatments may be carried out on titanium oxide in any order of a silicon oxide treatment, an aluminum oxide treatment and an organosiloxane treatment.

The treating amounts are preferably 0.1 to 10% by mass of aluminum oxide, 0.1 to 5% by mass of silicon oxide and 0.1 to 5% by mass of an organosiloxane with respect to the titanium oxide particle. If the treating amount is smaller than the lower limit, there arises a risk that the affinity between a liquid-crystal polyester and the titanium oxide and the dispersibility of the titanium oxide in a liquid-crystal polyester resin composition become insufficient; and if the treating amount exceeds the upper limit, there arises a risk that a treating agent is thermally decomposed in production of the liquid-crystal polyester resin composition to thereby lead to the degradation of the liquid-crystal polyester resin.

It is essential that titanium oxide used in the present invention is subjected to three types of surface treatments of an aluminum oxide treatment, a silicon oxide treatment and an organosiloxane treatment. The processing temperature when a liquid-crystal polyester resin composition is produced using an extruding machine exceeds 300° C. An organic compound such as an organosiloxane generally has a large risk of being thermally decomposed at this temperature level. However, use of the titanium oxide according to the present invention exhibits no remarkable deterioration of a liquid-crystal polyester resin due to decomposition of treating agents even at a high processing temperature exceeding 300° C., owing to the combination of an aluminum oxide treatment, a silicon oxide treatment and an organosiloxane treatment, thus allowing providing a liquid-crystal polyester resin composition blended with much titanium oxide.

Titanium oxide having been subjected to an aluminum oxide treatment, a silicon oxide treatment and an organosiloxane treatment is available in markets. Examples thereof include "DCF-T-17008S" (trade name), made by Resino Color Industry Co., Ltd.

The blending amount of the titanium oxide according to the present invention is in the range of 50 parts by mass to 150 parts by mass with respect to 100 parts by mass of a liquid-crystal polyester. If the blending amount is less than 50 parts by mass, a sufficient whiteness cannot be obtained; and if the blending amount exceeds 150 parts by mass, the moldability remarkably decreases. By making the blending amount of the titanium oxide in the above-mentioned range, a molded object can securely be obtained which has a reflectance of the molded surface of the molded object of 85% or higher to light of a wavelength of 480 nm, and an Izod impact strength of 40 kJ/m$^2$ or higher.

<Inorganic Fibrous Filler (C)>

In the resin composition according to the present invention, a well-known inorganic fibrous filler can be added in the range of not damaging the advantage of the present invention. Examples of the inorganic fibrous filler include glass fiber, carbon fiber, silicon carbide fiber, alumina fiber and wollastonite. These may be used singly or in two or more thereof.

The length of an inorganic fibrous filler is preferably 10 μm to 3 mm, and more preferably 100 μm to 3 mm, in terms of number-average length. The thickness of an inorganic fibrous filler is preferably 6 to 15 μm, and more preferably 6 to 10 μm, in terms of number-average diameter.

The blending amount of an inorganic fibrous filler is 0 to 50 parts by mass with respect to 100 parts by mass of a liquid-crystal polyester.

In the liquid-crystal polyester resin composition according to the present invention, in the case where the composition contains no inorganic fibrous filler (C), the blending amount of a titanium oxide (B) is preferably 60 to 150 parts by mass, and more preferably 100 to 150 parts by mass, with respect to 100 parts by mass of a liquid-crystal polyester, from the viewpoint of obtaining a high whiteness.

In the liquid-crystal polyester resin composition according to the present invention, in the case where the composition contains an inorganic fibrous filler (C), it is preferable from the viewpoint of raising the bending strength that the blending amounts of a titanium oxide (B) and an inorganic fibrous filler (C) are 50 to 150 parts by mass and 10 to 50 parts by mass, respectively, with respect to 100 parts by mass of a liquid-crystal polyester, and the total blending amount of the titanium oxide (B) and the inorganic fibrous filler (C) is 50 to 150 parts by mass with respect to 100 parts by mass of the liquid-crystal polyester.

A molded object obtained by injection molding the liquid-crystal polyester resin composition according to the present invention preferably has a reflectance of 85% or higher to light of a wavelength of 480 nm on the molded surface thereof, and an Izod impact strength of 40 kJ/m$^2$ or higher, and more preferably has a reflectance thereof of 87% or higher, and an Izod impact strength of 40 kJ/m$^2$ or higher.

The liquid-crystal polyester resin composition according to the present invention comprises a liquid-crystal polyester, a titanium oxide having been subjected to surface treatments of an aluminum oxide treatment, a silicon oxide treatment and an organosiloxane treatment, and as required, an inorganic fibrous filler in the above-mentioned proportion, so that a molded object having the above-mentioned reflectance and Izod impact strength can be obtained. The present inventors believe that this effect is due to that the affinity between the titanium oxide and the liquid-crystal polyester resin and the dispersibility of the titanium oxide in the resin composition are improved by the above-mentioned combination of three types of specific surface treatments.

In the case of a liquid-crystal polyester resin composition in which a conventional titanium oxide is blended, if the filling amount of the titanium oxide is made large, the melt viscosity becomes high to worsen the moldability; by contrast, the liquid-crystal polyester resin composition according to the present invention in which a blended titanium oxide having been subjected to the above-mentioned three types of specific surface treatments exhibits a lower melt viscosity than a conventional one with the same filling amount of titanium oxide. The melt viscosity becoming low is usually caused by the deterioration (molecular scission) of the liquid-crystal polyester resin involved in melting and kneading; and in this case, the impact strength largely decreases. By contrast, the liquid-crystal polyester resin composition according to the present invention exhibits a high Izod impact strength even if the melt viscosity becomes low. The present inventors believe that this reason is because the affinity between the titanium oxide and the liquid-crystal polyester resin, and the like may contribute.

<About a Method for Producing a Liquid-Crystal Polyester Resin Composition>

The liquid-crystal polyester resin composition according to the present invention can be obtained by melting and kneading the above-mentioned each component (a liquid-crystal polyester, a titanium oxide, and as required, an inorganic fibrous filler). As an apparatus for melting and kneading, a single-screw kneading machine, a twin-screw kneading machine, a Banbury mixer, a pressurized kneading machine or the like can be used, but a twin-screw kneading machine is especially preferable from the point of making the dispersion of the titanium oxide particle suitable. More preferable are continuous extrusion-type twin-screw kneading machines having a pair of double-flight screws, and above all, a corotating one which has a cutting and turning mechanism to enable a filler to be homogeneously dispersed is preferable. Use of the kneading machine which has a cylinder diameter of 40 mmϕ or larger having a large clearance between a barrel and the screws that makes the penetration of the filler easy, which has a large meshing between the screws of a contact gear ratio of 1.45 or larger, and in which the filler can be fed from a midway of the cylinder can efficiently provide the resin composition according to the present invention. Further, use of the kneading machine which has a facility to feed at least a part of the inorganic fibrous filler to a midway of the cylinder is preferable.

It is preferable that the liquid-crystal polyester, the titanium oxide, and the inorganic fibrous filler are mixed using a well-known solid mixing facility, for example, a ribbon blender, a tumbler blender and a Henschel mixer, and dried by a hot air drier, a reduced-pressure drier or the like according to needs, and fed from a hopper of a twin-screw kneading machine.

In production of a resin composition containing an inorganic fibrous filler, at least a part of the inorganic fibrous filler blended is preferably fed from a midway of a cylinder of a twin-screw kneading machine (so-called side-feed). Thereby, the mechanical strength of weld portions of a molded object prepared by injection molding an obtained resin composition is likely to be more improved than the case where all the inorganic fibrous fillers are fed together with other raw materials from a hopper (so-called top-feed). The proportion of the side-fed inorganic fibrous filler in the total amount of the inorganic fibrous filler blended is preferably 50% or more, and most preferably 100%. In the case of the side-fed proportion of less than the lower limit described above, compounding (blending and mixing) becomes difficult, and a homogeneous resin composition is unlikely to be obtained.

<About a Molded Object and an Optical Device>

The molded object according to the present invention is prepared by molding the above-mentioned liquid-crystal polyester resin composition according to the present invention. The molding method includes injection molding, extrusion molding and press molding, but injection molding using an injection molding machine is preferable from the viewpoint of the easiness, mass productivity and cost of molding. For example, by injection molding the palletized liquid-crystal polyester resin composition according to the present invention and making a surface of the injection molded article a reflecting surface, an LED reflector can be obtained which is excellent in the light reflectance and the mechanical properties (particularly, Izod impact strength), and particularly an LED reflector can be obtained which has a good light reflectance to light of wavelength of 480 nm and is suitable for a white LED.

The cylinder temperature in the case of injection molding can be set in the range of ±20° C. based on the melting point of a liquid-crystal polyester.

The optical device according to the present invention comprises a light source, and a reflector of the light source, the reflector being composed of the molded object described above according to the present invention. The light source is preferably a white LED.

EXAMPLES

Hereinafter, the present invention will be described more specifically, but the present invention is not limited to the following Examples.

(Production of a Thermotropic Liquid-Crystal Polyester: Melt Polycondensation)

In a 1.7-m$^3$ internal volume-reaction tank made of SUS316L (stainless steel) and having a double-helical stirring blade, 298.3 kg (2.16 kmol) of p-hydroxybenzoic acid (made by Ueno Fine Chemicals Industry, Ltd.), 134.1 kg (0.72 kmol) of 4,4'-dihydroxydiphenyl (made by Honshu Chemical Industry Co., Ltd.), 89.7 kg (0.54 kmol) of terephthalic acid (made by Mitsui Chemicals Inc.), 29.9 kg (0.18 kmol) of isophthalic acid (made by A.G. International Chemical Co., Inc.), and 0.11 kg of magnesium acetate (made by Kishida Chemical Co., Ltd.) and 0.04 kg of potassium acetate (made by Kishida Chemical Co., Ltd.) as catalysts were charged. Pressure reduction-nitrogen injection of the polymerization tank was carried out twice to replace the atmosphere of the tank by nitrogen; thereafter, 377.7 kg (3.7 kmol) of acetic anhydride was further added; the rotation speed of the stirring blade was set at 45 rpm, and the temperature of the mixture was raised to 150° C. over 1.5 hours; and an acetylation reaction was carried out under refluxing for 2 hours. After the completion of the acetylation, the temperature was raised at 0.5° C./min to 310° C. in an acetic acid-distilling out state, and the polymerization reaction was carried out for 5 hours and 20 minutes while generated acetic acid was being removed.

Then, the reaction tank system was closed, and the interior of the system was pressurized at 14.7 N/cm$^2$ (1.5 kgf/cm$^2$) with nitrogen; and about 480 kg of a wholly aromatic thermotropic liquid-crystal polyester of a low degree of polymerization as a melt polycondensation reaction product in the reaction tank was taken out from an extraction port of the bottom of the reaction tank, and fed to a cooling and solidifying apparatus described later. The temperature of the melt polycondensation reaction product at this time was 310° C.

(Cooling and Solidifying Step)

As a cooling and solidifying apparatus, an apparatus was prepared which had a pair of cooling rolls having a diameter of 630 mm with the distance between the rolls of 2 mm, and having a pair of weirs having a distance of 1,800 mm, according to Japanese Patent Application Laid-Open Publication No. 2002-179779. The pair of cooling rolls of the apparatus was contra-rotated at a rotation frequency of 18 rpm; while the fluid-state melt polycondensation reaction product taken out from the polycondensation reaction tank was gradually fed to a recess formed of the pair of cooling rolls and the pair of weirs, and held in the recess, the flow volumes of cooling water in the pair of cooling rolls were regulated to regulate the roll surface temperature, and the melt polycondensation reaction product was made to pass between the rolls to be cooled and solidified, to thus obtain a sheet-shaped solid material of 2 mm in thickness. The surface temperature of the wholly aromatic thermotropic liquid-crystal polyester of a low degree of polymerization which had been cooled and solidified right after passing between the rolls was 220° C. The obtained sheet-shaped solid material was crushed to about 50 mm square by a crusher (made by Nikku Industry Co., Ltd.).

(A Grinding Step and a Solid-Phase Polycondensation Step)

The crushed material obtained above was ground using a Feather Mill, made by Hosokawa Micron Corp., to obtain a raw material for solid-phase polycondensation. The ground material was one passing a mesh of a sieve opening of 1 mm.

The obtained crushed material was packed in a rotary kiln; the temperature was raised from room temperature to 170° C. over 3 hours in a nitrogen atmosphere under circulation of nitrogen, then raised to 250° C. over 5 hours, and raised further to 280° C. over 3 hours to carry out a solid-phase polycondensation, to thus obtain about 480 kg of a wholly aromatic thermotropic liquid-crystal polyester.

(Measurement of a Melting Point)

The melting point of a liquid-crystal polyester was measured by a differential scanning calorimeter (DSC), made by Seiko Instruments Inc., using α-alumina as its reference. At this time, the temperature was raised from room temperature to 400° C. at a temperature-rise rate of 20° C./min to completely melt the polymer; thereafter, the temperature was descended to 150° C. at a rate of 10° C./min; and a vertex of an endothermic peak acquired while the temperature was being again raised to 420° C. at a rate of 20° C./min was defined as a melting point. The melting point measured by DSC was 350° C.

(Titanium Oxide and Other Fillers)

Titanium oxide A:

trade name "DCF-T-17008S", made by Resino Color Industry Co., Ltd. (titanium oxide having been subjected to surface treatments of an aluminum oxide treatment, a silicon oxide treatment and an organosiloxane treatment; the primary particle diameter: 0.25 μm)

Titanium oxide B:

trade name "SR-1", made by Sakai Chemical Industry Co., Ltd. (titanium oxide obtained by subjecting a rutile-type titanium oxide obtained by the sulfuric acid method containing a roasting step to a surface treatment with aluminum oxide; the primary particle diameter: 0.25 μm)

Titanium Oxide C:

trade name "R-21", made by Sakai Chemical Industry Co., Ltd. (titanium oxide obtained by subjecting a rutile-type titanium oxide obtained by the sulfuric acid method containing a roasting step to a surface treatment with aluminum oxide and silicon oxide; the primary particle diameter: 0.20 μm)

Glass Fiber:

"PX-1", made by Owens Corning Corp., (the average fiber length: 3 mm; the average diameter: 10 μm)

Production of Resin Compositions

Examples 1 to 5, and Comparative Examples 1 to 5

For each Example, 100 parts by mass of the wholly aromatic thermotropic liquid-crystal polyester obtained above was mixed with the titanium oxide particles A, B and C and the glass fiber so that each component thereof made a composition (the composition in Table 1 is in terms of parts by mass) shown in Table 1, and melted and kneaded using a twin-screw extruding machine (PCM-30, made by Ikegai Corp.) at a maximum cylinder temperature of 370° C., to obtain a pellet of a resin composition.

<Production of Injection Molded Articles>

From the each obtained pellet, an injection molded article of 30 mm (width)×60 mm (length)×3.0 mm (thickness) was obtained by injection molding using an injection molding machine (SG-25, made by Sumitomo Heavy Industries, Ltd.) at a cylinder temperature of 350° C., an injection speed of 100 mm/sec, and a mold temperature of 80° C. This was made a test piece for white light reflectance. Bending test pieces according to ASTM D790 were further fabricated by injection molding of the same condition as above, and made test pieces for bending test and impact test.

(Measurement of a White Light Reflectance)

For the surface of the each test piece, the diffuse reflectance to light of 480 nm was measured using a self-recording spectrophotometer (U-3500, made by Hitachi, Ltd.). Here, the reflectance was a relative value when a diffuse reflectance of a standard white plate of barium sulfate was taken to be 100%. The results are shown in Table 1.

(Measurement of a Bending Strength)

By using the test piece for bending test fabricated above, the bending strength was measured according to ASTM D790. The results are shown in Table 1.

(Measurement of an Izod Impact Strength)

By using the test piece for impact test fabricated above, the Izod impact strength with no notch was measured according to ASTM D256. An average value of ten measurements was calculated. The results are shown in Table 1.

(Evaluation of the Productivity)

A resin composition which could provide a pellet thereof was evaluated as "A"; and a resin composition which could not provide a pellet thereof due to a difficulty in melting, kneading and extrusion was evaluated as "C" under the production condition of the resin composition as above. The results are shown in Table 1. The resin composition which could not provide a pellet thereof could not be subjected to the other evaluation tests.

(Measurement of a Melt Viscosity)

An apparent viscosity at 370° C. of a liquid-crystal polyester resin composition was defined as a melt viscosity thereof. The apparent viscosity was measured using a capillary rheometer (model: 2010, made by INTESCO Co., Ltd.) using a capillary of 1.00 mm in diameter, 40 mm in length and 90° in inflow angle, and at a shear rate of 100 sec$^{-1}$ under a constant-rate heating at a temperature-rise rate of +4° C./min from 300° C.; and an apparent viscosity at 370° C. was determined, and defined as a melt viscosity. The results are shown in Table 1. In the measurement, the resin composition was previously dried in a vacuum drier at 150° C. for 4 hours.

TABLE 1

| | Thermotropic Liquid-Crystal Polyester | Titanium Oxide | | | Glass Fiber | Reflectance %, 480 nm | Bending Strength (MPa) | Izod Impact Strength IIS (kJ/m$^2$) | Melt Viscosity (Pa·s) | Productivity |
|---|---|---|---|---|---|---|---|---|---|---|
| | | A | B | C | | | | | | |
| Example 1 | 100 | 125 | 0 | 0 | 25 | 90 | 150 | 40 | 80 | A |
| Example 2 | 100 | 67 | 0 | 0 | 0 | 88 | 165 | 90 | 70 | A |
| Example 3 | 100 | 60 | 0 | 0 | 40 | 85 | 180 | 65 | 75 | A |
| Example 4 | 100 | 106 | 0 | 0 | 6 | 89 | 150 | 60 | 80 | A |
| Example 5 | 100 | 150 | 0 | 0 | 0 | 87 | 130 | 40 | 90 | A |
| Comparative Example 1 | 100 | 0 | 75 | 0 | 13 | 84 | 120 | 30 | 180 | A |

TABLE 1-continued

| | Thermotropic Liquid-Crystal Polyester | Titanium Oxide A | B | C | Glass Fiber | Reflectance %, 480 nm | Bending Strength (MPa) | Izod Impact Strength IIS (kJ/m²) | Melt Viscosity (Pa·s) | Productivity |
|---|---|---|---|---|---|---|---|---|---|---|
| Comparative Example 2 | 100 | 0 | 0 | 75 | 13 | 82 | 120 | 30 | 150 | A |
| Comparative Example 3 | 100 | 75 | 0 | 0 | 75 | 78 | 190 | 40 | 100 | A |
| Comparative Example 4 | 100 | 156 | 0 | 0 | 0 | 82 | 90 | 15 | 150 | A |
| Comparative Example 5 | 100 | 233 | 0 | 0 | 0 | — | — | — | — | C |

It was confirmed that the injection molded articles fabricated using the resin compositions of Examples 1, 4 and 5, containing more than 100 parts by mass of the titanium oxide A (having been subjected to an aluminum oxide treatment, a silicon oxide treatment and an organosiloxane treatment) filled therein with respect to 100 parts by mass of the liquid-crystal polyester, had very high reflectances of 90%, 89% and 87%, and high mechanical strengths of Izod impact strengths of 40 kJ/m² or higher, respectively. It was confirmed that the injection molded article fabricated using the resin composition of Example 2, containing the titanium oxide A filled therein in a proportion of 67 parts by mass with respect to 100 parts by mass of the liquid-crystal polyester, had a reflectance of 88%, and a very excellent mechanical strength of an Izod impact strength of 90 kJ/m². It was confirmed that the injection molded article fabricated using the resin composition of Example 3, containing the titanium oxide A filled therein in a proportion of 60 parts by mass with respect to 100 parts by mass of the liquid-crystal polyester, had a high reflectance of 85%, and a high Izod impact strength of 65 kJ/m², although the amount of the titanium oxide was smaller than that in the composition of Comparative Example 1 which used the titanium oxide B. It was also found that any of the injection molded articles fabricated using the resin compositions of Examples 1 to 5 had a high bending strength of 130 MPa or higher, while having a low melt viscosity of lower than 100 Pa·s although containing titanium oxide in a large filling amount, and having good moldability.

By contrast, the injection molded article fabricated using the resin composition of Comparative Example 1, containing the conventional titanium oxide B filled therein in a proportion of 75 parts by mass with respect to 100 parts by mass of the liquid-crystal polyester, had a reflectance of 84%, but had as low an Izod impact strength as 30 kJ/m², revealing having an insufficient mechanical strength. The injection molded article fabricated using the resin composition of Comparative Example 2, containing the titanium oxide C which had been subjected to two types of surface treatments of an aluminum oxide treatment and a silicon oxide treatment and which was filled therein in a proportion of 75 parts by mass with respect to 100 parts by mass of the liquid-crystal polyester, had a reflectance of 82%, and had as low an Izod impact strength as 30 kJ/m². The injection molded article fabricated using the resin composition of Comparative Example 3 contained the titanium oxide A in a proportion of 75 parts by mass with respect to 100 parts by mass of the liquid-crystal polyester, but contained the glass fiber of 75 parts by mass, exceeding the upper limit of the present invention. As a result, the injection molded article had a high bending strength of 190 MPa, but had a low reflectance of 78%. Since the resin composition of Comparative Example 4 had a content of the titanium oxide A exceeding the upper limit according to the present invention, the Izod impact strength of the fabricated injection molded article largely decreased. Since the resin composition of Comparative Example 5 had an excessively higher content of the titanium oxide A than that of Comparative Example 4, the production of the resin composition was difficult and no pellet was obtained.

As described above, the liquid-crystal polyester resin compositions according to the present invention, shown in the Examples, in spite of having low melt viscosities, exhibited high Izod impact strengths, and reflectances in high levels superior to those of conventional articles; and it was thus found that both a high reflectance and a high mechanical strength could be achieved simultaneously, which could have not be achieved conventionally.

INDUSTRIAL APPLICABILITY

The present invention can provide: a liquid-crystal polyester resin composition which can provide a molded object simultaneously satisfying, at high levels, both the light reflectance at 480 nm and the mechanical strength such as Izod impact strength; a molded object thereof; and an optical device having the molded object. The liquid-crystal polyester resin composition according to the present invention, even if being one prepared through a usual melting and kneading step, holds excellent heat resistance and moldability of liquid-crystal polyesters, and can form the molded object excellent in a white light reflectance and the Izod impact strength by injection molding. The injection molded object of the liquid-crystal polyester resin composition according to the present invention can be used as a reflector with a surface of the molded object as a reflecting surface, and can be used particularly as a reflector suitable for a white LED. Since the present invention can achieve the reflector having a higher reflectance than conventional ones and being excellent in the mechanical strength as well, the present invention can provide the optical device having the reflector and being excellent in the light extraction efficiency.

The invention claimed is:
1. A liquid-crystal polyester resin composition, comprising: 100 parts by mass of a liquid-crystal polyester (A) that is a wholly aromatic thermotropic liquid-crystal polyester having a melting point of 320° C. or higher; 50 to 150 parts by mass of a titanium oxide (B) having been subjected to only an aluminum oxide treatment, a silicon oxide treatment and an organosiloxane treatment as surface treatments; and 0 to 50 parts by mass of an inorganic fibrous filler (C), wherein a molded object obtained by injection molding the liquid-crystal polyester resin composition has a reflectance of 85% or higher to light of a wavelength of 480 nm on a molded surface thereof, and an Izod impact strength of the molded object of 40 kJ/m$^2$ or higher.

2. The liquid-crystal polyester resin composition according to claim 1, wherein the titanium oxide (B) has a primary particle diameter in the range of 0.2 to 0.3 μm.

3. A molded object, being obtained by injection molding a liquid-crystal polyester resin composition according to claim 1.

4. An optical device, comprising: a light source; and a reflector of the light source, the reflector comprising a molded object according to claim 3.

5. The optical device according to claim 4, wherein the light source is a white LED.

6. A liquid-crystal polyester resin composition according to claim 1, wherein at least one of the aluminum oxide treatment, the silicon oxide treatment, and the organosiloxane treatment is applied directly on a surface of the titanium dioxide (B).

* * * * *